(12) United States Patent
Hirano et al.

(10) Patent No.: US 7,215,215 B2
(45) Date of Patent: May 8, 2007

(54) PHASE MODULATION APPARATUS, POLAR MODULATION TRANSMISSION APPARATUS, WIRELESS TRANSMISSION APPARATUS AND WIRELESS COMMUNICATION APPARATUS

(75) Inventors: Shunsuke Hirano, Yokohama (JP); Hisashi Adachi, Mino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 169 days.

(21) Appl. No.: 11/078,703

(22) Filed: Mar. 14, 2005

(65) Prior Publication Data
US 2005/0285688 A1 Dec. 29, 2005

(30) Foreign Application Priority Data
Mar. 15, 2004 (JP) ............... 2004-073172

(51) Int. Cl.
H03C 3/06 (2006.01)

(52) U.S. Cl. .................. 332/128; 332/127; 331/34; 331/16

(58) Field of Classification Search ............... 332/127, 332/128; 331/34, 16
See application file for complete search history.

(56) References Cited
U.S. PATENT DOCUMENTS

| | | | |
|---|---|---|---|
| 4,308,508 A | 12/1981 | Sommer et al. | |
| 5,952,895 A | 9/1999 | McCune, Jr. et al. | |
| 6,211,747 B1 | 4/2001 | Trichet et al. | |
| 6,809,585 B2 * | 10/2004 | Chadwick | 329/325 |

* cited by examiner

Primary Examiner—Arnold Kinkead
(74) Attorney, Agent, or Firm—Stevens, Davis, Miller & Mosher, LLP

(57) ABSTRACT

A phase modulation apparatus is provided whereby excellent RF phase modulation signals can be obtained even when the modulation sensitivity of a voltage controlled oscillator varies. Phase modulation apparatus 100 has: phase detector 105 that performs phase detection with respect to an RF phase modulation signal outputted from VCO 101; comparator 106 that compares the phase of the detected signal with the phase of a baseband phase modulation signal and outputs the difference between the signals; variable gain amplifier 107 that controls the gain of the baseband phase modulation signal based on the output of comparator 106 and supplies the gain-controlled baseband phase modulation signal to VCO 101. By this means, the signal level of the baseband phase modulation signal that is supplied to VCO 101 can be controlled in accordance with the modulation sensitivity of VCO 101, so that phase modulation apparatus 100 can be realized whereby excellent RF phase modulation signals even when the modulation sensitivity of VCO 101 varies.

9 Claims, 14 Drawing Sheets

PHASE MODULATION APPARATUS, POLAR MODULATION TRANSMISSION APPARATUS, WIRELESS TRANSMISSION APPARATUS AND WIRELESS COMMUNICATION APPARATUS

BACKGROUND OF THE INVENTION

1. Technical Field

The present invention relates specifically to a phase modulation apparatus, polar modulation transmission apparatus, wireless transmission apparatus and wireless communication apparatus that perform phase modulation utilizing the PLL (Phase Locked Loop).

2. Description of the Related Art

Heretofore, phase modulation apparatuses utilizing the PLL have been widely used to modulate carrier signals by baseband modulation signals and form transmission signals (that is, to up-convert baseband modulation signals to radio frequency). Generally, phase modulation apparatuses of this type are expected to realize low costs, low power consumption, excellent noise characteristics, and high modulation accuracy. To modulate signals using the PLL, and, in particular, to improve modulation accuracy using the PLL, the PLL frequency bandwidth (i.e. PLL bandwidth) is preferably wider than the frequency bandwidth of the modulation signal (i.e. modulation bandwidth).

However, widening the PLL bandwidth has the risk of deteriorating noise characteristics. So, the technology called "two-point modulation" is presently proposed whereby the PLL bandwidth is set narrower than the modulation bandwidth, and the modulation within the PLL bandwidth and the modulation outside the PLL bandwidth are performed at two different points (see, for example, U.S. Pat. No. 4,308,508).

FIG. 1 shows the configuration of a phase modulation apparatus utilizing conventional two-point modulation PLL. Phase modulation apparatus 10 has: a voltage controlled oscillator (VCO) 1 that changes the oscillation frequency in accordance with the voltage in the control voltage terminal; frequency divider 2 that divides the frequency of an RF phase modulation signal outputted from VCO 1; phase detector 3 that compares the phase of the output signal of frequency divider 2 with the phase of a reference signal and outputs a signal in accordance with the phase different between the two signals; and loop filter 4 that equalizes the output signal of phase detector 3 and outputs the result. Phase modulation apparatus 10 adds a phase modulation signal generated in modulation signal generator 5 to carrier frequency data and supplies the result as the frequency division ratio in frequency divider 2, thereby performing modulation at the first point.

In addition, phase modulation apparatus 10 lets the phase modulation signal pass through post filter 6 and thereafter adds the phase modulation signal to the output of loop filter 4, and supplies the result to the control voltage terminal of VCO 1, thereby performing modulation at the second point.

The use of the two-point frequency modulation technology such as described above makes it possible to output wideband RF modulation signals that stretch outside the PLL bandwidth, even when the PLL bandwidth is set narrower than the modulation bandwidth. As a result, the deterioration in noise characteristics due to the PLL is minimized.

FIG. 2 shows frequency characteristics in baseband domain for explanation of the operation of two-point modulation PLL. H(s) is a transfer function that indicates the frequency characteristics of the PLL, where s=jω. H(s) has low pass characteristics, such as shown in FIG. 2. The modulation signal added to the frequency division ratio set in frequency divider 2 is low pass filtered by the transfer function H(s) by the PLL. On the other hand, the modulation signal outputted from post filter 6 is added to the control voltage terminal of VCO 1 and thereby high pass filtered by the transfer function 1-H(s), such as shown in FIG. 2. That is, if the modulation signal is Φ (s), the baseband component in the RF modulation signal outputted from VCO 1 bears no relationship to the frequency characteristics of the PLL, as shown by the following formula:

$$H(s)\Phi(s) + \{1-H(s)\}\Phi(s) = \Phi(s) \tag{1}$$

Applying two-point modulation thus to the PLL makes it possible to output wideband RF modulation signals that stretch outside the PLL bandwidth, from VCO 1. Incidentally, fs is the sampling frequency.

However, when the kind of configuration disclosed in the specification of above U.S. Pat. No. 4,308,508 is employed, if VCO 1 is integrated in LSI, element values vary due to the nature of manufacturing. As a result, modulation sensitivity varies in each LSI. The modulation sensitivity varies also by temperature. When the modulation sensitivity of VCO 1 varies, this makes it difficult to obtain desired output signals (i.e. RF modulation signals). Now, FIG. 3 illustrates an ideal VCO output signal, and FIG. 4 illustrates a VCO output signal where the modulation sensitivity varies.

As a solution to the above-noted problem, there is a phase modulation apparatus disclosed in U.S. Pat. No. 5,952,895. This phase modulation apparatus is also one of the two point modulation PLL type and yet differs from the configuration disclosed in patent document 1 in that the modulation at the first point is performed by modulating a reference signal.

FIG. 5 illustrates the configuration of the phase modulation apparatus disclosed in patent document 2. Phase modulation apparatus 20 has: a voltage controlled oscillator (VCO) 21 that changes the oscillation frequency in accordance with the voltage in the control voltage terminal; down converter 25 comprised of mixer 22, synthesizer 23 and low pass filter (LPF) 24; frequency divider 26 that divides the frequency of a down-converted RF phase modulation signal; phase detector (PD) 27 that compares the phase of the output signal of frequency divider 26 with the phase of a reference signal and outputs a signal in accordance with the phase difference between the two signals; and loop filter (LPF: Low Pass Filter) 28 that equalizes the output signal of phase detector 27.

In addition, phase modulation apparatus 20 has direct digital synthesizer (DDS) 30. Based on a baseband input phase modulation signal, direct digital synthesizer 30 forms a phase modulation signal having the reference frequency at the center frequency, and sends this phase modulation signal to phase comparator 27 as a reference signal, thereby performing modulation at the first point.

In addition, phase modulation apparatus 20 adds the input phase modulation signal to the output of loop filter 28 by adder 31 and supplies the voltage of the signal after the addition to the control voltage terminal of VCO 101, thereby performing modulation at the second point.

Furthermore, phase modulation apparatus 20 has: phase detector 32 that performs phase detection with respect to the phase modulation signal outputted from low pass filter 24; comparator 33 that compares the detected signal with the baseband phase modulation signal and outputs the difference; and variable gain amplifier 34 that controls the gain of the baseband phase modulation signal based on the output of comparator 33 and supplies the gain-controlled baseband phase modulation signal to voltage controlled oscillator 21 in later stage of loop filter 28. In actuality, the baseband phase modulation signal subjected to gain control in variable gain amplifier 34 is added to the output of loop filter 28 in adder 31 and the result is supplied to voltage controlled oscillator 21.

Thus, in the above configuration, when a compassion result is obtained in comparator 33 that the signal level of the phase modulation signal is greater than the signal level of the phase detection signal, variable gain amplifier 34 increases the gain according to the difference value. If, in comparator 33, a comparison result is obtained that the signal level of the phase modulation signal is lower than the signal level of the phase detection signal, variable gain amplifier 34 lowers the gain according to the difference value.

As a result, phase modulation apparatus 20 makes it possible to adjust the modulation level automatically even when the modulation sensitivity of voltage controlled oscillator 21 varies.

However, to achieve good modulation accuracy characteristics in phase modulation apparatus 20 having the configuration of FIG. 5, the resolution of DDS 30 needs to be set high. However, increasing the resolution requires high speed clock, which gives a rise to another problem of increased power consumption.

In addition, the tradeoff with power consumption and the maximum operation frequency of the circuit set further limitations to increasing the clock, and so, in reality, the DDS output frequency cannot be heightened much. As a result, the PLL bandwidth needs to be made narrow, which gives a rise to yet another problem of increased PLL lock up time.

SUMMARY OF THE INVENTION

It is therefore an object of the present invention to provide a phase modulation apparatus that achieves excellent RF phase modulation signals even when the modulation sensitivity of a voltage controlled oscillator varies, and a polar modulation transmission apparatus, wireless transmission apparatus and wireless communication apparatus that achieve high quality transmission signal seven when the modulation sensitivity of a voltage controlled oscillator varies.

The phase modulation apparatus of the present invention achieves the above object by having: a PLL circuit; a frequency divider that is provided in the PLL circuit and sets a frequency division ratio of the PLL circuit based on a baseband modulation signal and a carrier frequency signal; an adder that is provided between a low pass filter and a voltage controlled oscillator in the PLL circuit and adds voltage in accordance with the baseband modulation signal to output voltage of the low pass filter and supplies a resulting voltage to a control voltage terminal of the voltage controlled oscillator; a phase detector that performs phase detection with respect to an RF phase modulation signal outputted from the voltage controlled oscillator; a comparator that compares a RF phase modulation signal after the phase detection with the baseband modulation signal and outputs a difference between the signals; and a gain controller that controls a gain of the baseband modulation signal based on an output of the comparator and outputs the gain-controlled baseband modulation signal to the adder.

The present polar modulation transmission apparatus of the present invention achieves the above object by having: an amplitude phase converter that forms a phase modulation signal and an amplitude modulation signal based on transmission data; a PLL circuit that receives as input the phase modulation signal and outputs an RF phase modulation signal; a frequency divider that is provided in the PLL circuit and sets a frequency division ratio of the PLL circuit based on the phase modulation signal and a carrier frequency signal; an adder that is provided between a low pass filter and a voltage controlled oscillator in the PLL circuit and adds voltage in accordance with the phase modulation signal to output voltage of the loop filter and supplies a resulting voltage to a control voltage terminal of the voltage controlled oscillator; and a high frequency power amplifier that changes an amplitude of the RF phase modulation signal outputted from the voltage controlled oscillator in accordance with the amplitude modulation signal; a coupler that detects an output signal of the high frequency power amplifier; an amplitude limiter that sets a limit to the amplitude of the signal detected by the coupler; a phase detector that performs phase detection with respect to the signal outputted from the amplitude limiter; a comparator that compares the signal after the phase detection with the phase modulation signal and outputs a difference between the signals; and a gain controller that controls a gain of the phase modulation signal based on an output of the comparator and outputs the gain-controlled phase modulation signal to the adder.

The wireless transmission apparatus of the present invention achieves the above object by having: a phase modulation apparatus having the above-described configuration; and an amplifier that amplifies an RF phase modulation signal outputted from the phase modulation apparatus.

The wireless communication apparatus of the present invention achieves the above object by having: a transmitter having the above-described configuration; and a receiver that demodulates a received signal.

BRIEF DESCRIPTION OF THE DRAWINGS

The above and other objects and features of the invention will appear more fully hereinafter from a consideration of the following description taken in connection with the accompanying drawings in which.

DETAILED DESCRIPTION OF PREFERRED EMBODIMENTS

Embodiments of the present invention will be described in detail below with reference to the accompanying drawings.

Embodiment 1

Figure 1:
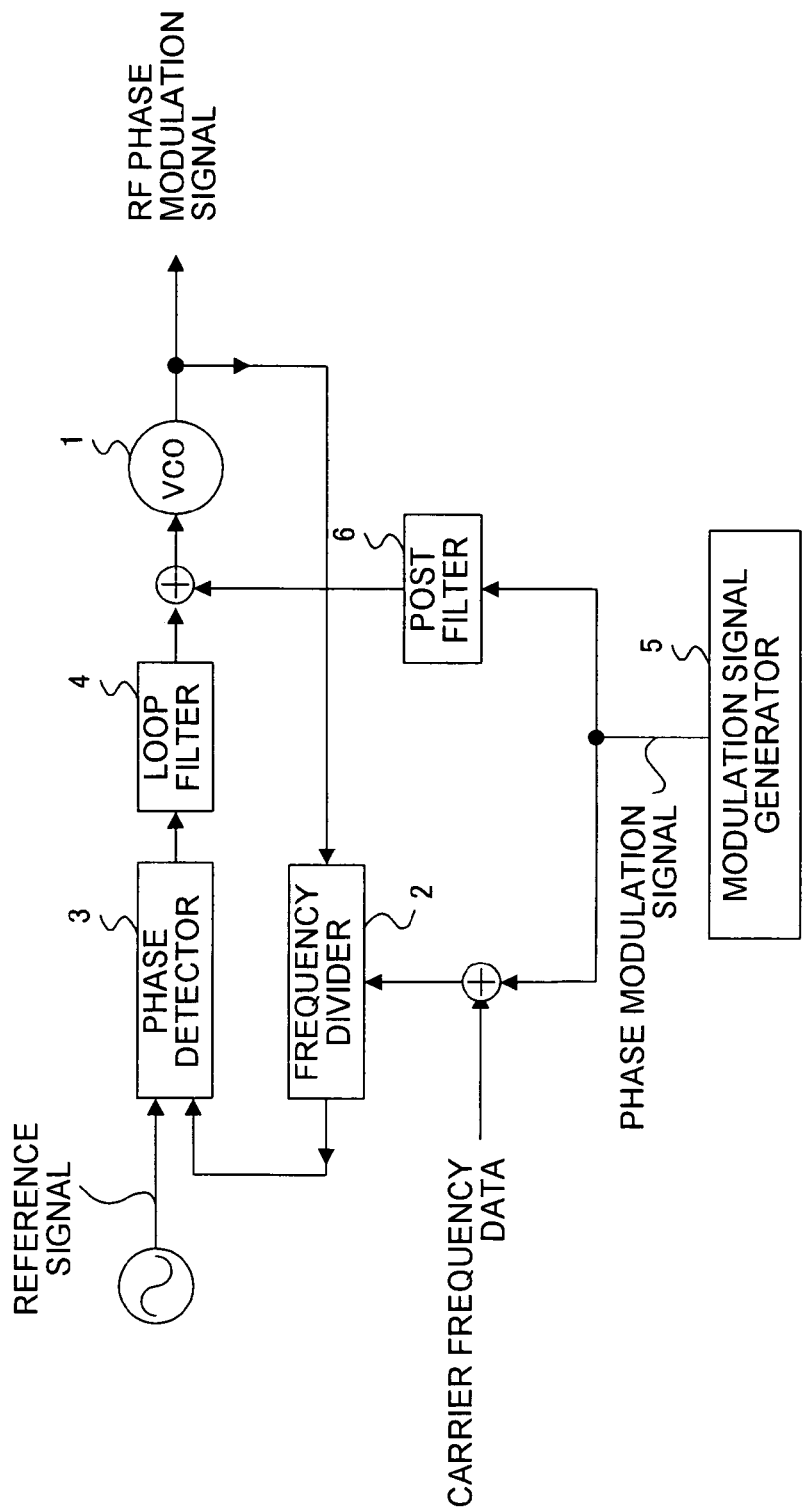
FIG. 1 is a block diagram showing a configuration of a conventional two-point phase modulation apparatus.
Figure 2:
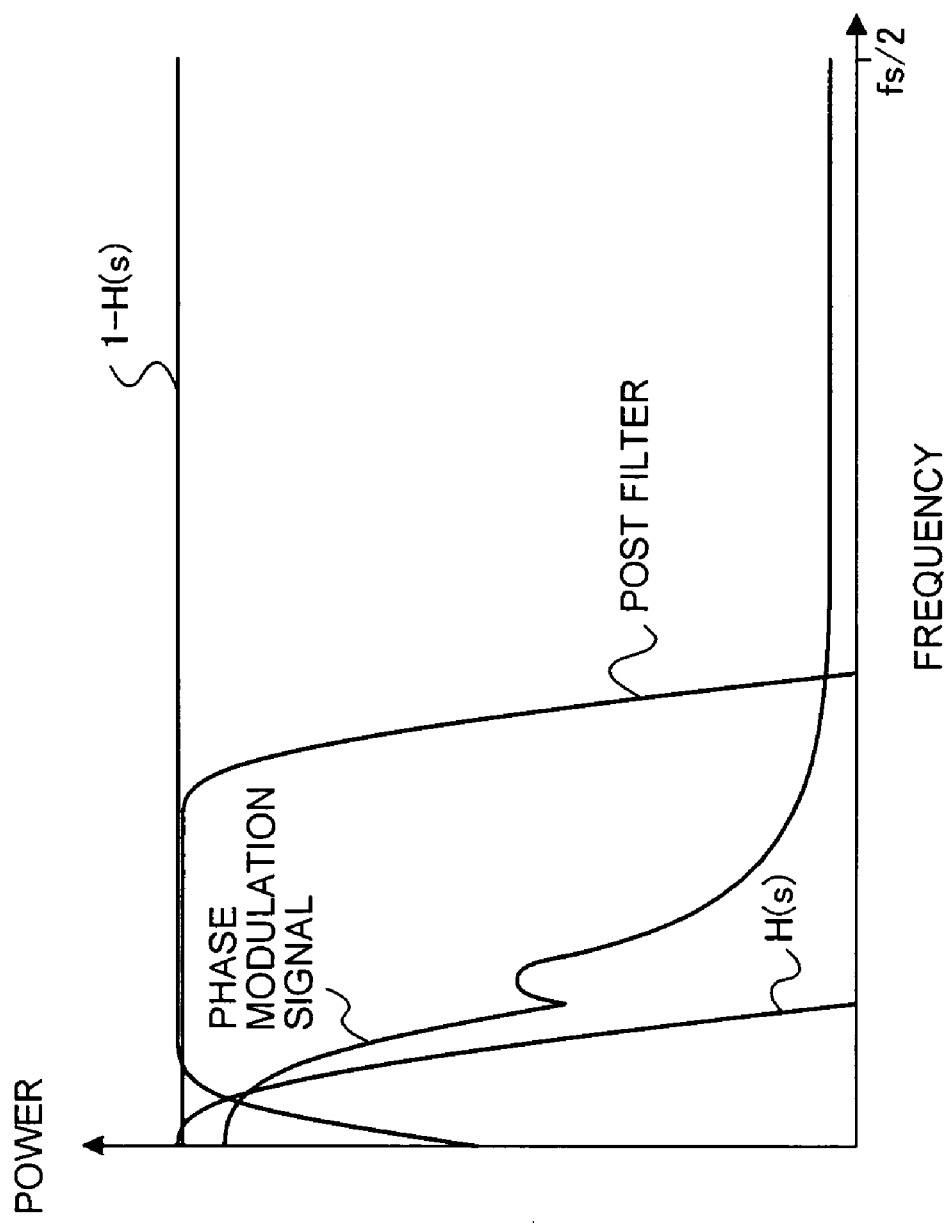
FIG. 2 is a characteristic curve of baseband signal spectrum in a two-point phase modulation apparatus.
Figure 3:
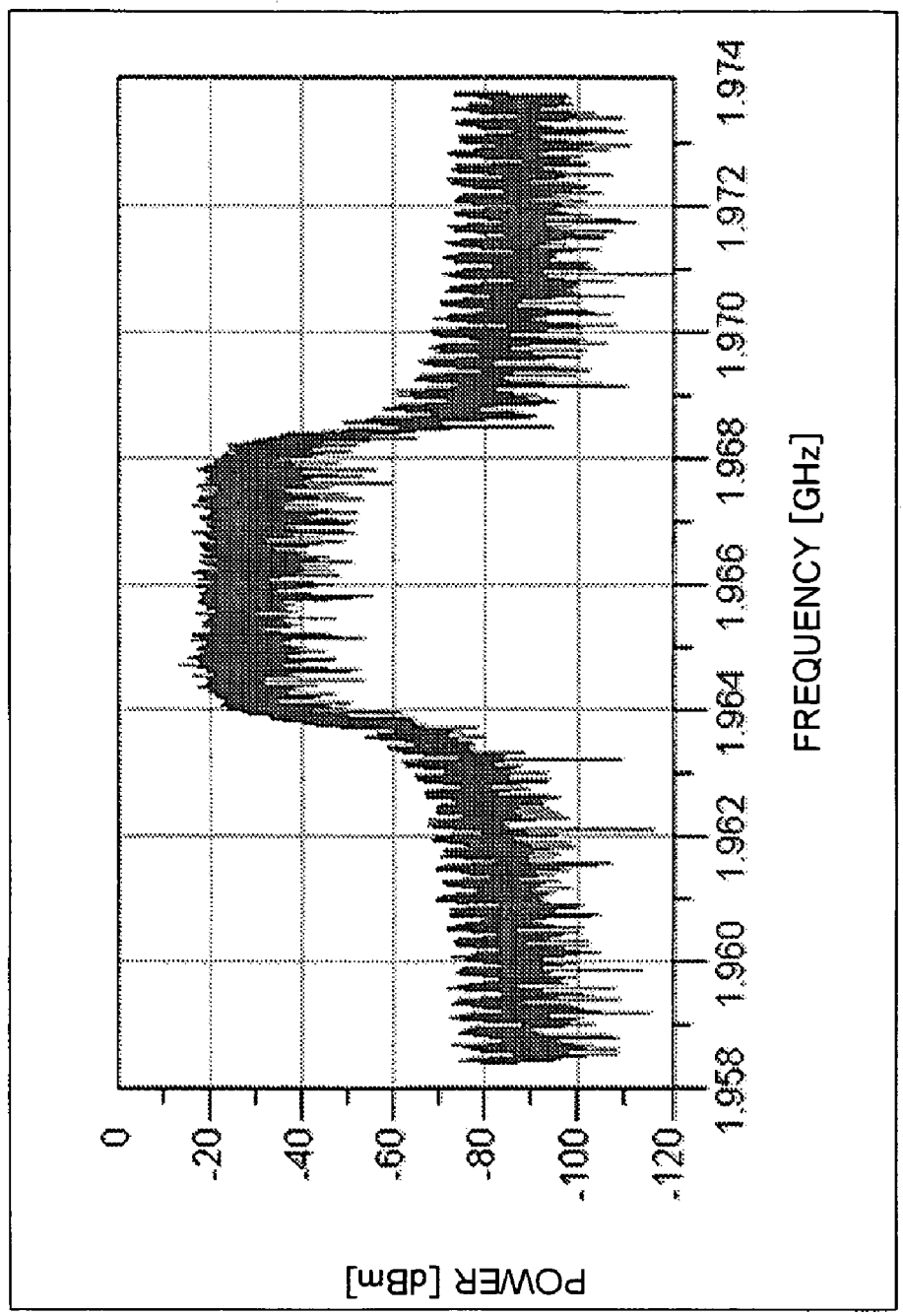
FIG. 3 is a characteristic diagram showing ideal output of a VCO.
Figure 4:
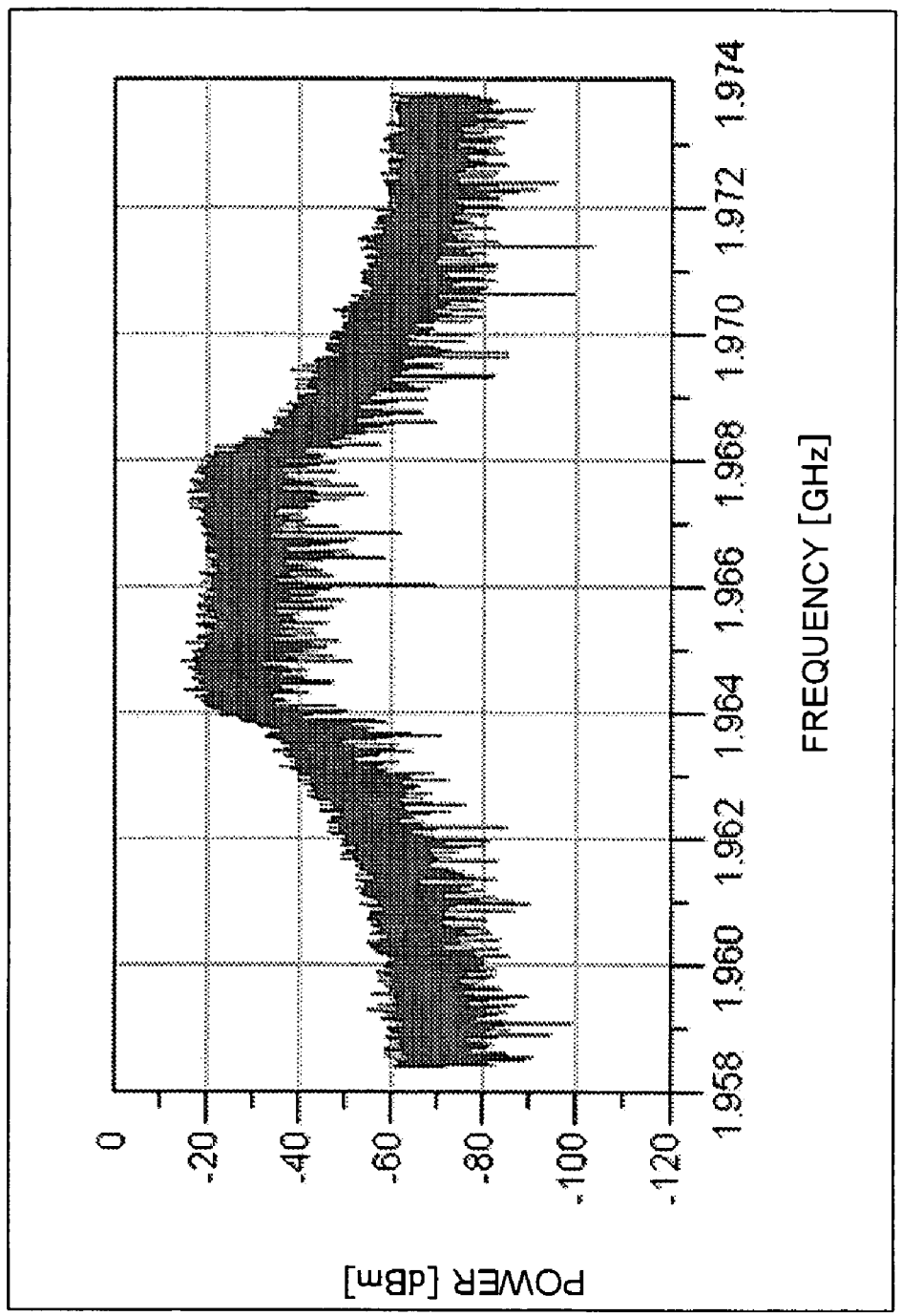
FIG. 4 is a characteristic diagram showing output of a VCO where the modulation sensitivity varies.
Figure 5:
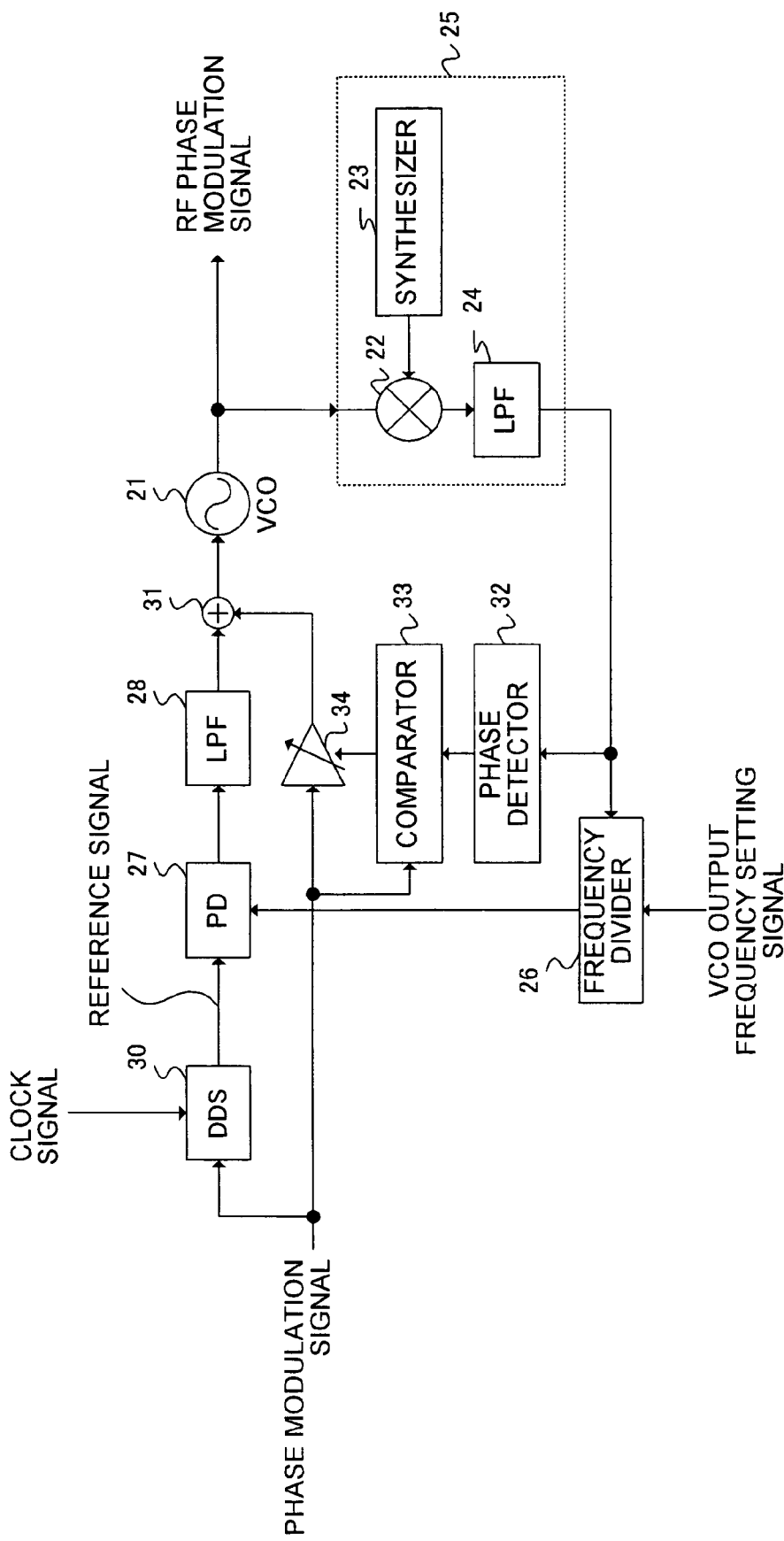
FIG. 5 is a block diagram showing a configuration of a conventional two-point phase modulation apparatus.
Figure 6:
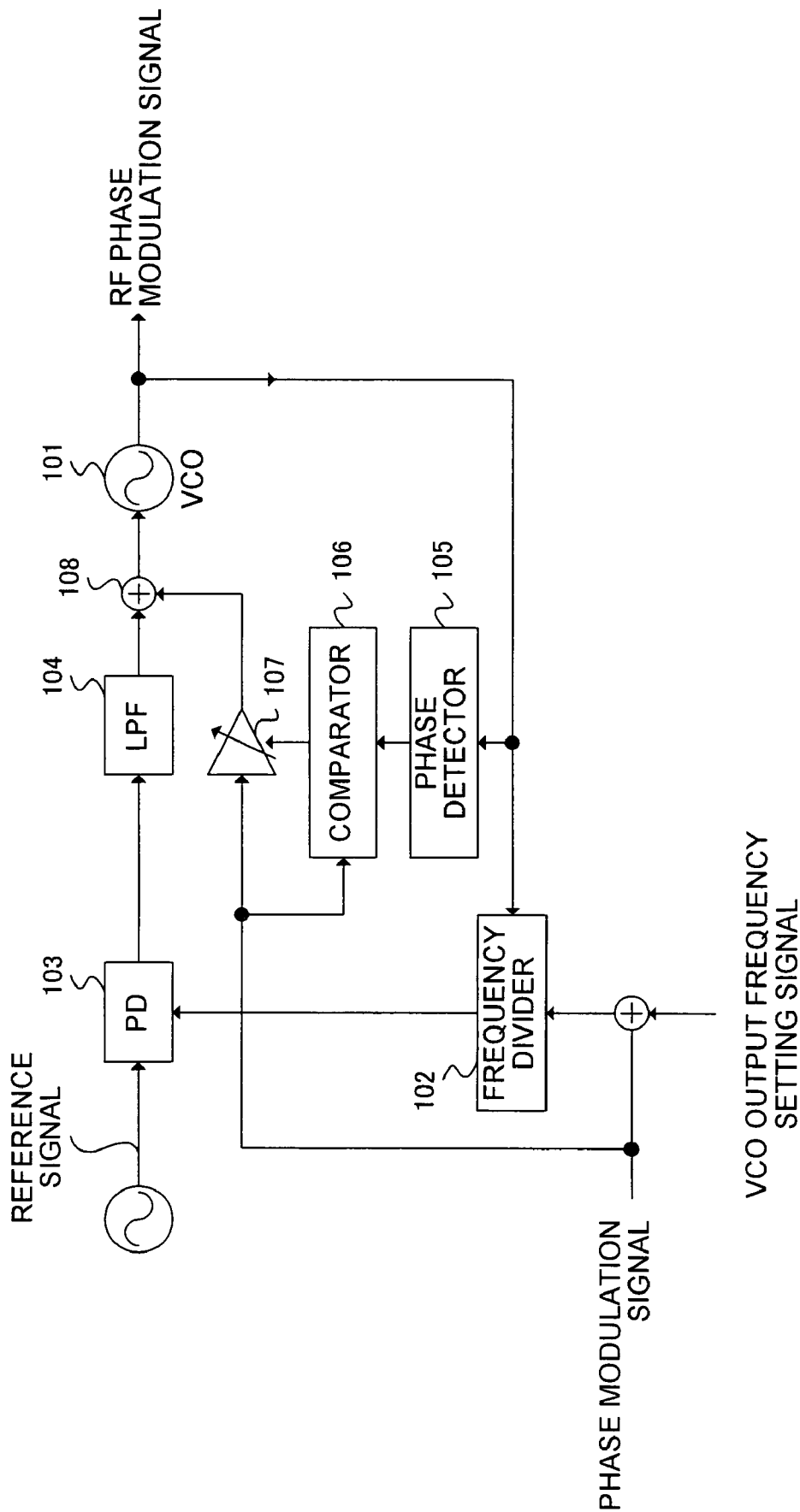
FIG. 6 is a block diagram showing a configuration of a phase modulation apparatus according to Embodiment 1 of the present invention.

FIG. 6 illustrates the configuration of a phase modulation apparatus according to Embodiment 1 of the present invention. Phase modulation apparatus 100 has: voltage controlled oscillator (VCO) 101 that changes the oscillation frequency in accordance with the voltage in the control voltage terminal; frequency divider 102 that divides the frequency of an RF phase modulation signal outputted from VCO 1; phase detector (PD) 103 that compares the phase of the output signal of frequency divider 102 with the phase of a reference signal and outputs a signal in accordance with the phase difference between the two signals; and loop filter (LPF: Low Pass Filter) 104 that equalizes the output signal of phase detector 103 and outputs the result. Phase modulation apparatus 100 thus adds a baseband input phase modulation signal to a VCO output frequency setting signal (i.e. carrier frequency data) and provides the result to frequency divider 102 as the frequency division ratio, thereby performing modulation at the first point.

In addition, frequency modulation apparatus 100 is designed to add the input phase modulation signal to the output of loop filter 104 by adder 108 and supply the result to the control voltage terminal of VCO 101, thereby performing modulation at the second point.

Incidentally, rather than the type of schemes that add baseband phase modulation signals to the reference signal, as above the type of schemes that change the frequency division ratio over time by inputting baseband phase modulation signals in a frequency divider and set the average value as the desired frequency division ratio are commonly referred to as the fractional-N scheme. In comparison to the type of schemes that add baseband phase modulation signals to the reference signal, the use of the fractional-N scheme makes it possible to set the comparison frequency in the phase detector high and accordingly shorten the PLL lock-up time.

To input a signal obtained by adding a baseband phase modulation signal and a reference signal in a phase detector, for example, using a direct digital synthesizer (DDS) is one possible option, and yet heightening the resolution of the DDS would require high speed clock at increased power consumption. In reality, the clock can be heightened only to a certain limit, and so the DDS output frequency cannot be heightened much. As a result, the PLL bandwidth needs to be made narrow, which accordingly makes the PLL lock-up time longer. In view of the above noted points, the fractional-N scheme employed in the present embodiment is a very useful scheme.

In addition to the above-noted configurations, phase modulation apparatus 100 of the present embodiment has: phase detector 105 that performs phase detection with respect to an RF phase modulation signal outputted from VCO 101; comparator 106 that compares the detected signal with a baseband phase modulation signal and outputs a difference between the two signals; and variable gain amplifier 107 that controls the gain of the baseband phase modulation signal in accordance with the output of comparator 106 and supplies the gain-controlled baseband phase modulation signal to VCO 101 in later stage in loop filter 104. Incidentally, in reality, the baseband phase modulation signal subjected to gain control in variable gain amplifier 107 is added to the output of loop filter 104 by adder 108 and the result is supplied to VCO 101.

Given the above configurations, in phase modulation apparatus 100, when the modulation sensitivity (Hz/V) of VCO 101 is low, the signal level outputted from phase detector 105 becomes lower than the desired signal level. Consequently, when comparator 106 performs comparison operation subtracting a phase detection signal from a phase modulation signal, comparator 106 gives a positive difference value. Then, variable gain amplifier 107 heightens the gain of the phase modulation signal by the positive difference value and outputs the result.

In contrast, in phase modulation apparatus 100, when the modulation sensitivity (Hz/V) of VCO 101 is high, the signal level outputted from phase detector 105 becomes higher than the desired signal level. Consequently, when comparator 106 performs comparison operation subtracting a phase detection signal from a phase modulation signal, comparator 106 gives a negative difference value. Then, variable gain amplifier 107 lowers the gain of the phase modulation signal by the negative difference value and outputs the result.

In other words, when a comparison result is obtained in comparator 106 that the phase modulation signal has a greater signal level than the phase detection signal, variable gain amplifier 107 heightens the gain by the difference value. When a comparison result is obtained in comparator 106 that the phase modulation signal has a lower signal level than the phase detection signal, variable gain amplifier 107 lowers the gain by the difference value.

As a result, excellent RF phase modulation signals can be obtained even when the modulation sensitivity of VCO 101 varies.

The present embodiment thus has: phase detector 105 that performs phase detection with respect to an RF phase modulation signal outputted from VCO 101; comparator 106 that compares the detected RF phase modulation signal with the original phase modulation signal and outputs the difference between the two signals; and variable gain amplifier 107 that controls the gain of the phase modulation signal in accordance with the output of comparator 106 and supplies the gain-controlled phase modulation signal to VCO 101, thus implementing phase modulation apparatus 100 that can achieve excellent RF phase modulation signals even when the modulation sensitivity of VCO 101 varies.

Although a case has been described above with this embodiment where variable gain amplifier 107 is used as the gain controller to control the gain of a phase modulation signal in accordance with the output of comparator 106 and supply the gain-controlled phase modulation signal to VCO 101, the gain controller is by no means limited to variable gain amplifier, and any circuit that is capable of gain control would be applicable.

Moreover, although a case has been described above with this embodiment where the baseband modulation signal inputted in the phase modulation apparatus is a phase modulation signal, this is by no means limiting, and it is equally possible to input different types of modulation signals. This applies to Embodiments 2 to 4 as well, which will be described later in this specification. As will be later explained in Embodiment 5 and Embodiment 6 as well, the present embodiment presumes a case where the phase modulation apparatus of the present invention is applied to a polar modulation transmission apparatus, which is the reason that the phase modulation signal is used as an example. Still, the phase modulation apparatus of the present invention is also applicable to other devices and apparatuses besides wireless communication apparatuses employing the polar modulation scheme, and achieves the same advantage as the above-described embodiment.

Embodiment 2

Figure 7:
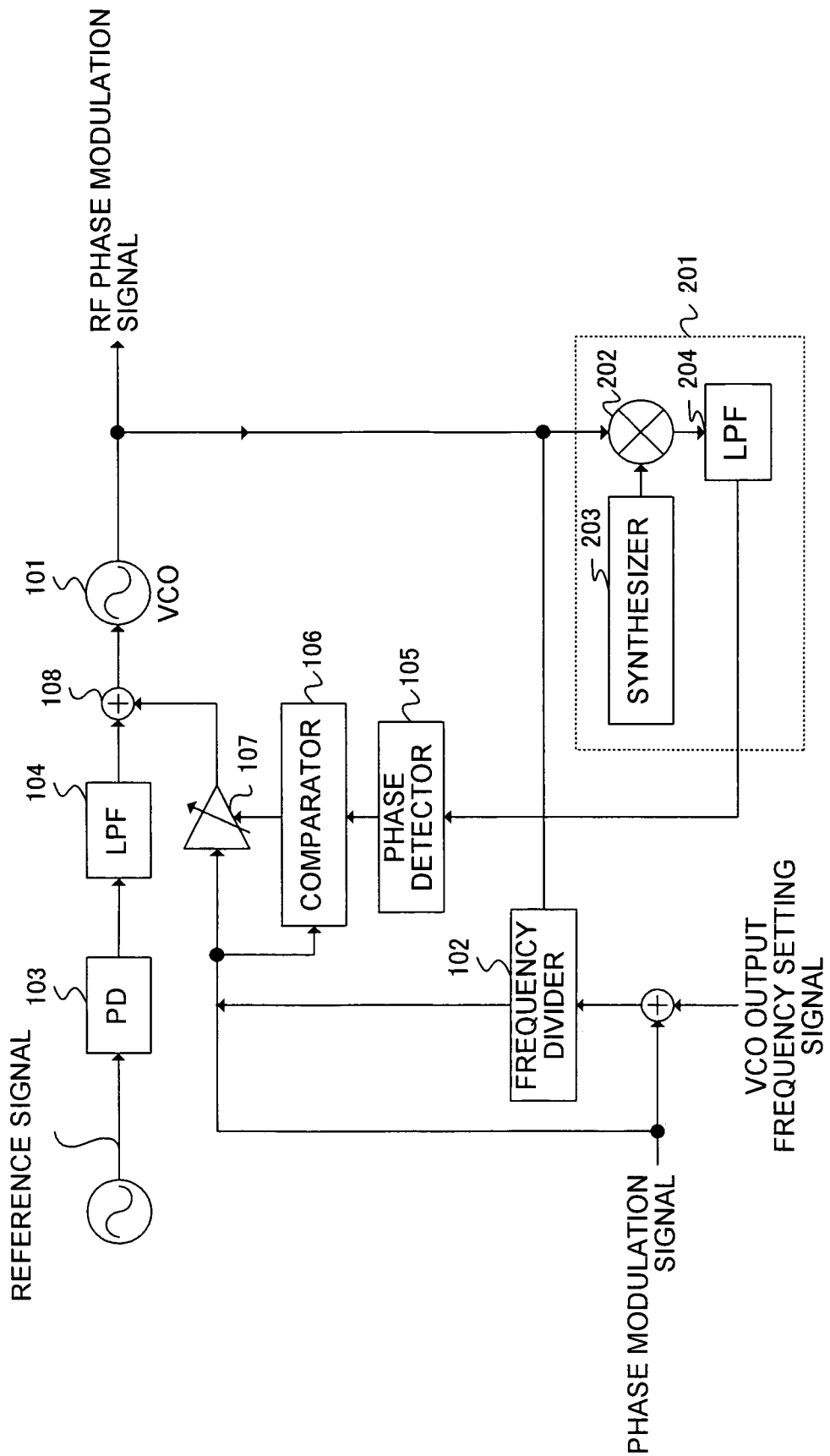
FIG. 7 is a block diagram showing a configuration of a phase modulation apparatus according to Embodiment 2.

FIG. 7 illustrates the phase modulation apparatus of the present embodiment. Parts in FIG. 7 that are identical to ones in FIG. 6 will be assigned the same reference numerals as in FIG. 6. In comparison to phase modulation apparatus 100 of Embodiment 1, phase modulation apparatus 200 has down converter 201 that down converts an RF phase modulation signal and sends the result to phase detector 105.

As shown in FIG. 7, down converter 201 has, for example, mixer 202, synthesizer 203, and low pass filter (LPF) 204, forming a configuration in which mixer 202 receives as input an RF phase modulation signal and a frequency generated by synthesizer 203 and mixer 202 lowers the frequency of the RF phase modulation signal to the frequency generated by synthesizer 203. The configuration of the down converter is by no means limited to the one described above, and any circuits would be applicable as long as the frequency of the RF phase modulation signal can be lowered.

The signal having its frequency lowered by down converter 201 is inputted in phase detector 105. The processing thereafter is the same as in Embodiment 1 and will not be described here again.

Thus, in addition to the configurations of Embodiment 1, the present embodiment has down converter 201 that down converts an RF phase modulation signal outputted from VCO 101 and supplies the result to phase detector 105, thus simplifying the configuration of phase detector 105 and improving the accuracy of detection in addition to the advantage of Embodiment 1.

Embodiment 3

Figure 8:
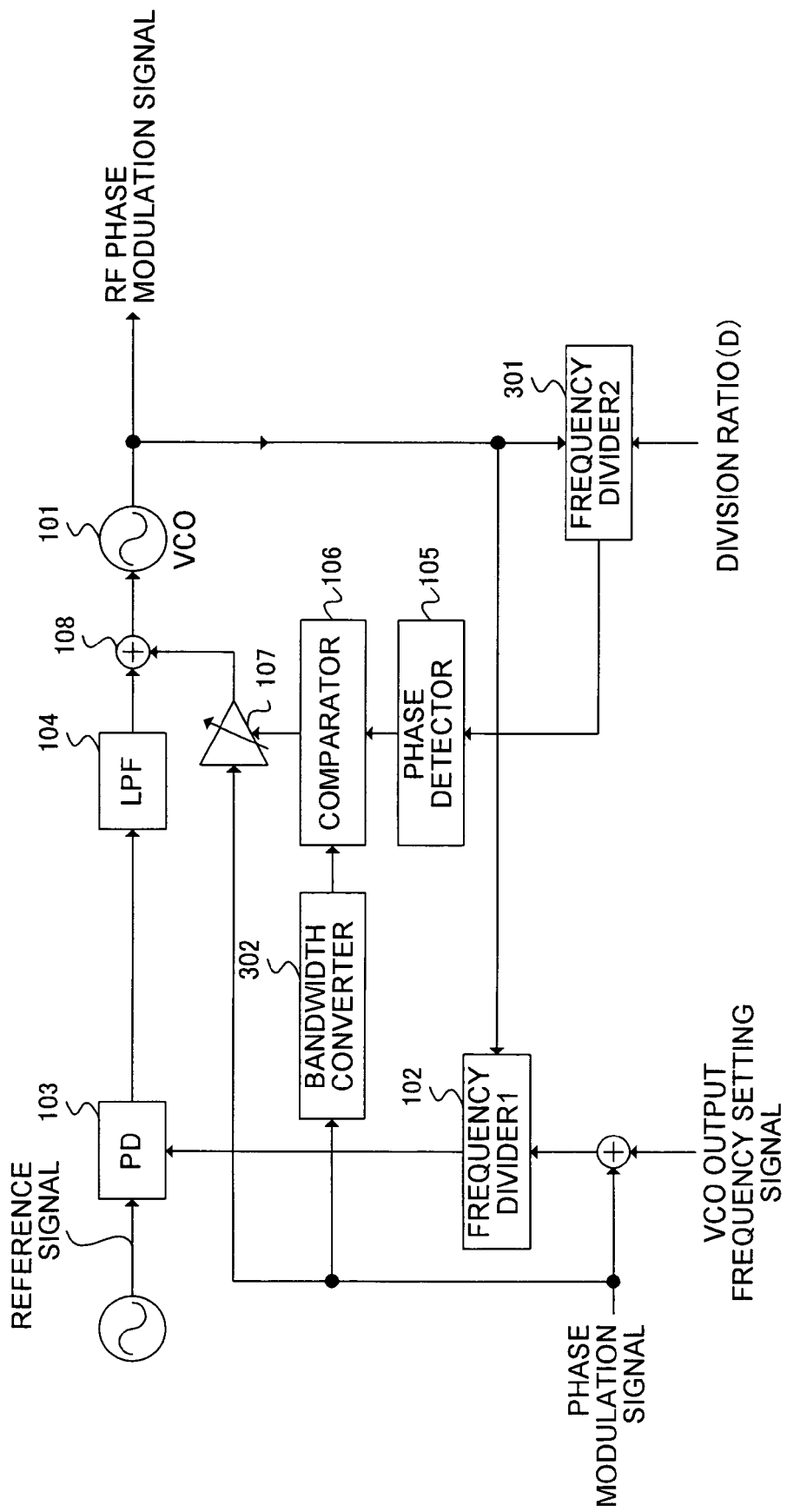
FIG. 8 is a block diagram showing a configuration of a phase modulation apparatus according to Embodiment 3.

FIG. 8 illustrates the phase modulation apparatus of the present embodiment. Parts in FIG. 8 that are identical to ones in FIG. 6 will be assigned the same reference numerals as in FIG. 6. In comparison to phase modulation apparatus 100 of Embodiment 1, phase modulation apparatus 300 has: frequency divider 301 that divides the frequency of an RF phase modulation signal outputted from VCO 101 and supplies the result to frequency divider 301; and bandwidth conversion circuit 302 that converts bandwidth of a phase modulation signal in accordance with the frequency division ratio of frequency divider 301 and supplies to result to comparator 106.

By thus providing frequency divider 301 and lowering the frequency of the RF phase modulation signal inputted in phase detector 105, it is possible to simplify the configuration of phase detector 105 and improve the accuracy of detection.

By the way, the bandwidth of the RF phase modulation signal decreases to 1/D after the RF phase modulation signal has passed frequency divider 301, where D is the frequency division ratio in frequency divider 301. So, by providing bandwidth conversion circuit 302 in phase modulation apparatus 300, the bandwidth of the phase modulation signal is made 1/D by bandwidth conversion circuit 302 and the result is inputted in comparator 106, thus making it possible to compare signals of the same bandwidth in comparator 106.

Figure 9:
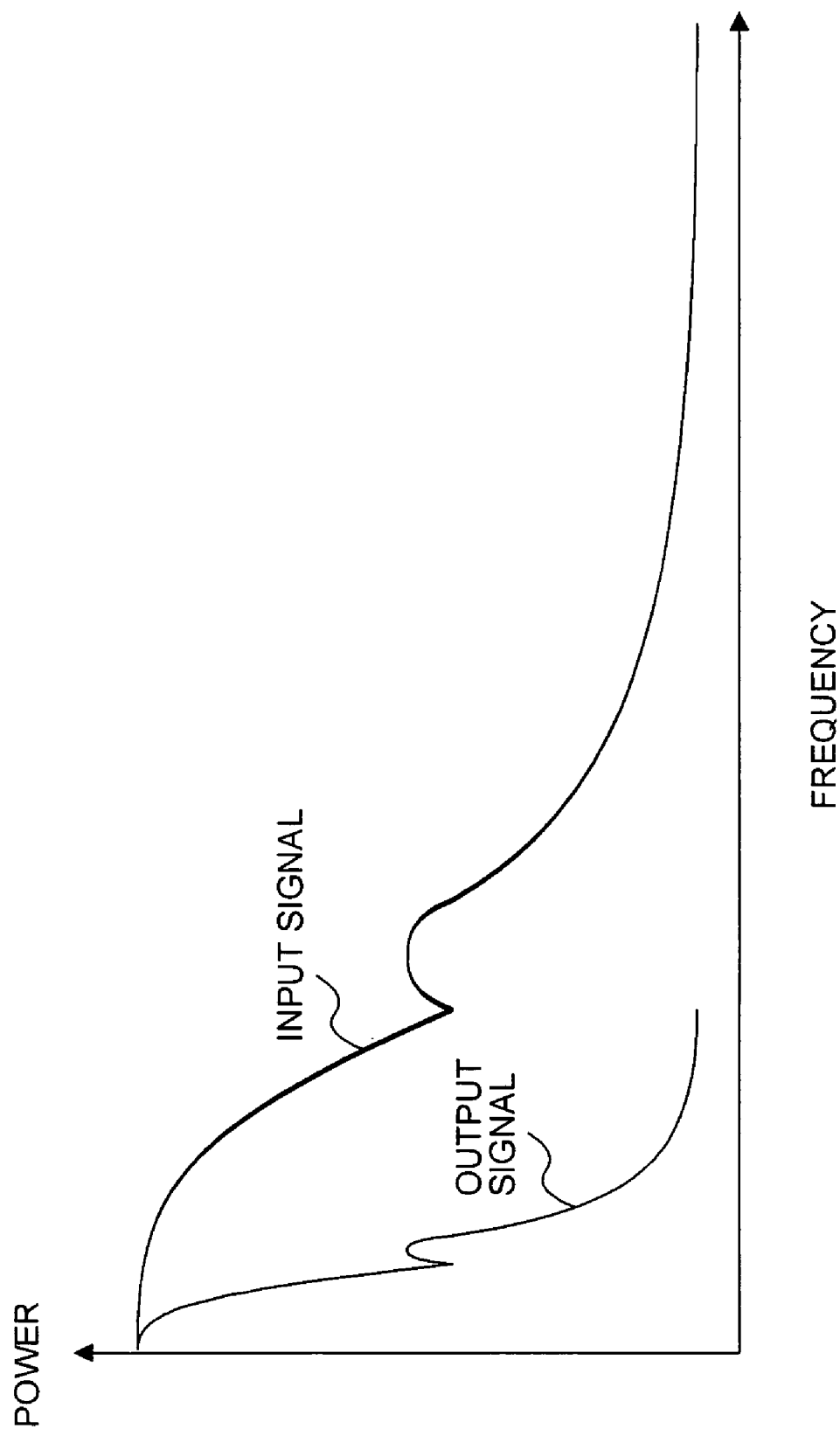
FIG. 9 is figure for the explanation of the operation of a bandwidth conversion circuit.
Figure 10:
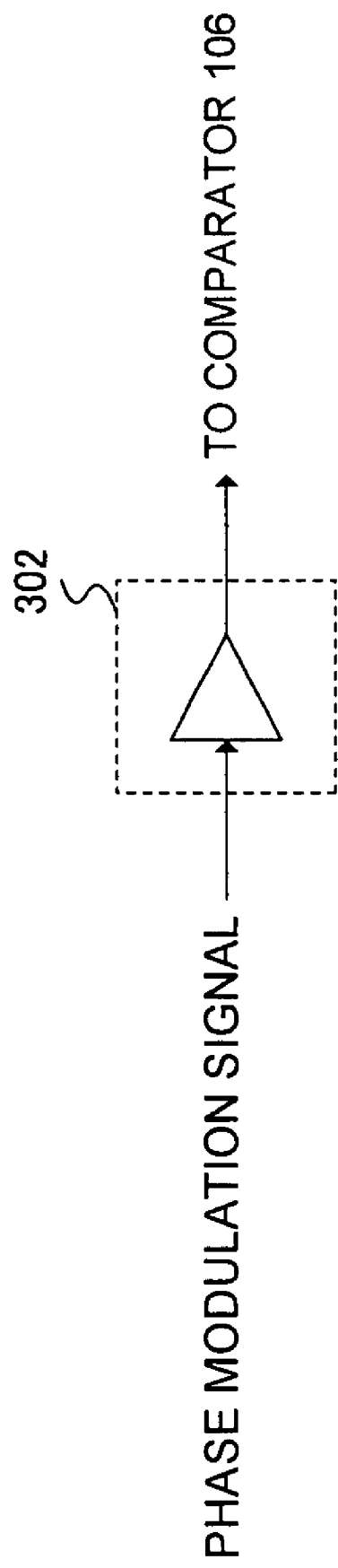
FIG. 10 illustrates a configuration of a bandwidth conversion circuit.

For example, bandwidth conversion circuit 302 has only to shift the frequency of an input signal by 1/D and output the result. The phase shifting operation by bandwidth conversion circuit 302 in this case is illustrated in FIG. 9. As shown in FIG. 10, bandwidth conversion circuit 302 can be implemented using an amplifier having a 1/D gain.

Incidentally, the frequency division ratio of frequency divider 301 can use fixed values. Using powers of two enables the use of asynchronous circuits so that the frequency divider may be implemented consuming less power.

Thus, in addition to the configurations of Embodiment 1, the present embodiment has: frequency divider 301 that divides the frequency of an RF phase modulation signal outputted from VCO 1 and supplies the result to phase detector 105; and bandwidth conversion circuit 302 that converts the bandwidth of a baseband phase modulation signal in accordance with the frequency division ratio in frequency divider frequency divider 301 and supplies to result to comparator 106, thus simplifying the configuration of phase detector 105 and improving the accuracy of detection in addition to the advantage of Embodiment 1.

Embodiment 4

Figure 11:
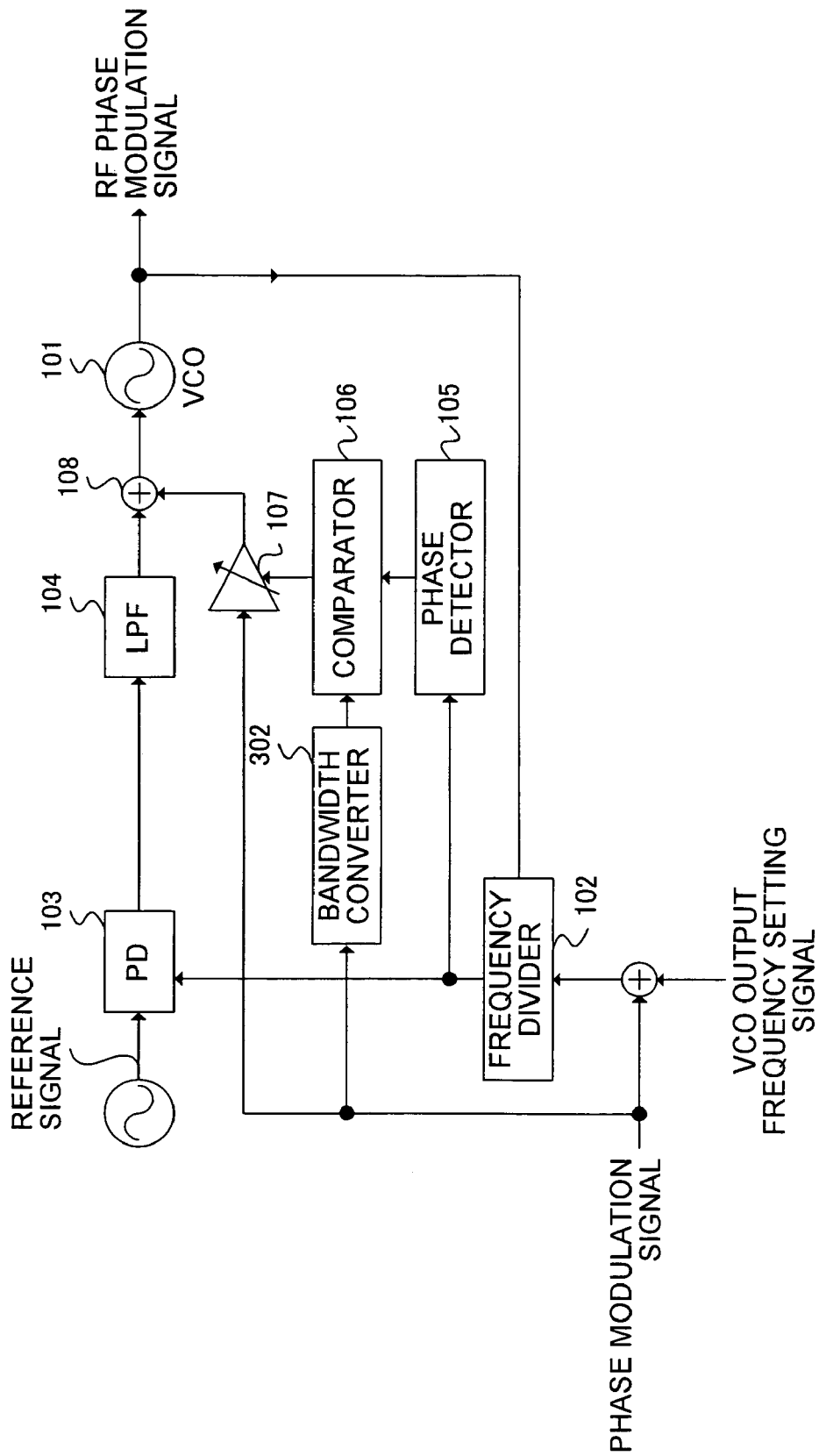
FIG. 11 is a block diagram showing a configuration of a phase modulation apparatus according to Embodiment 4.

FIG. 11 illustrates the phase modulation apparatus of the present embodiment. Parts in FIG. 11 that are identical to ones in FIG. 6 will be assigned the same reference numerals as in FIG. 6. In comparison to phase modulation apparatus 100 according to Embodiment 1, phase modulation apparatus 400 is configured such that the output of frequency divider 102 is inputted in phase detector 105, instead of inputting the RF phase modulation signal outputted from VCO 101 in phase detector 105. Phase modulation apparatus 400 also has bandwidth conversion circuit 302 that converts the bandwidth of a phase modulation signal in accordance with the frequency division ratio in frequency divider 102 and supplies the result to comparator 106.

By this means, in phase modulation apparatus 400, phase detector 105 detects low frequency signals outputted from frequency divider 102. Consequently, the present embodiment needs not be provided with down converter 201 that down converts an RF phase modulation signal as in Embodiment 2 and another frequency divider 301 as in Embodiment 3, thus improving the accuracy of phase detection by simpler configuration.

Now, the bandwidth of the RF phase modulation signal decreases to 1/N after the RF phase modulation signal has passed frequency divider 102, where N is the frequency division ratio in frequency divider 102. So, by providing bandwidth conversion circuit 302 in phase modulation apparatus 400, the bandwidth of the modulation signal is made 1/N by means of this bandwidth conversion circuit 302 and the result is inputted in comparator 106, thus making it possible to compare signals of the same bandwidth in comparator 106.

Thus, in comparison to the configurations of Embodiment 1, the present embodiment is configured such that the signal outputted from frequency divider 102 instead of an RF phase modulation signal is inputted in phase detector 105, and is further configured to have bandwidth conversion circuit 302 that converts the bandwidth of a baseband phase modulation signal in accordance with the frequency division ratio in frequency divider 102 and supplies the result to comparator 106, thus simplifying the configuration of phase detector 105 and improving the accuracy of detection in addition to the advantage of Embodiment 1. In addition, the present embodiment can be further simplified in configuration compared to Embodiment 2 and Embodiment 3.

Embodiment 5

In the present embodiment, a preferable configuration will be described below in conjunction with a case where the phase modulation apparatus of the present invention is applied to a polar modulation transmission apparatus.

Figure 12:
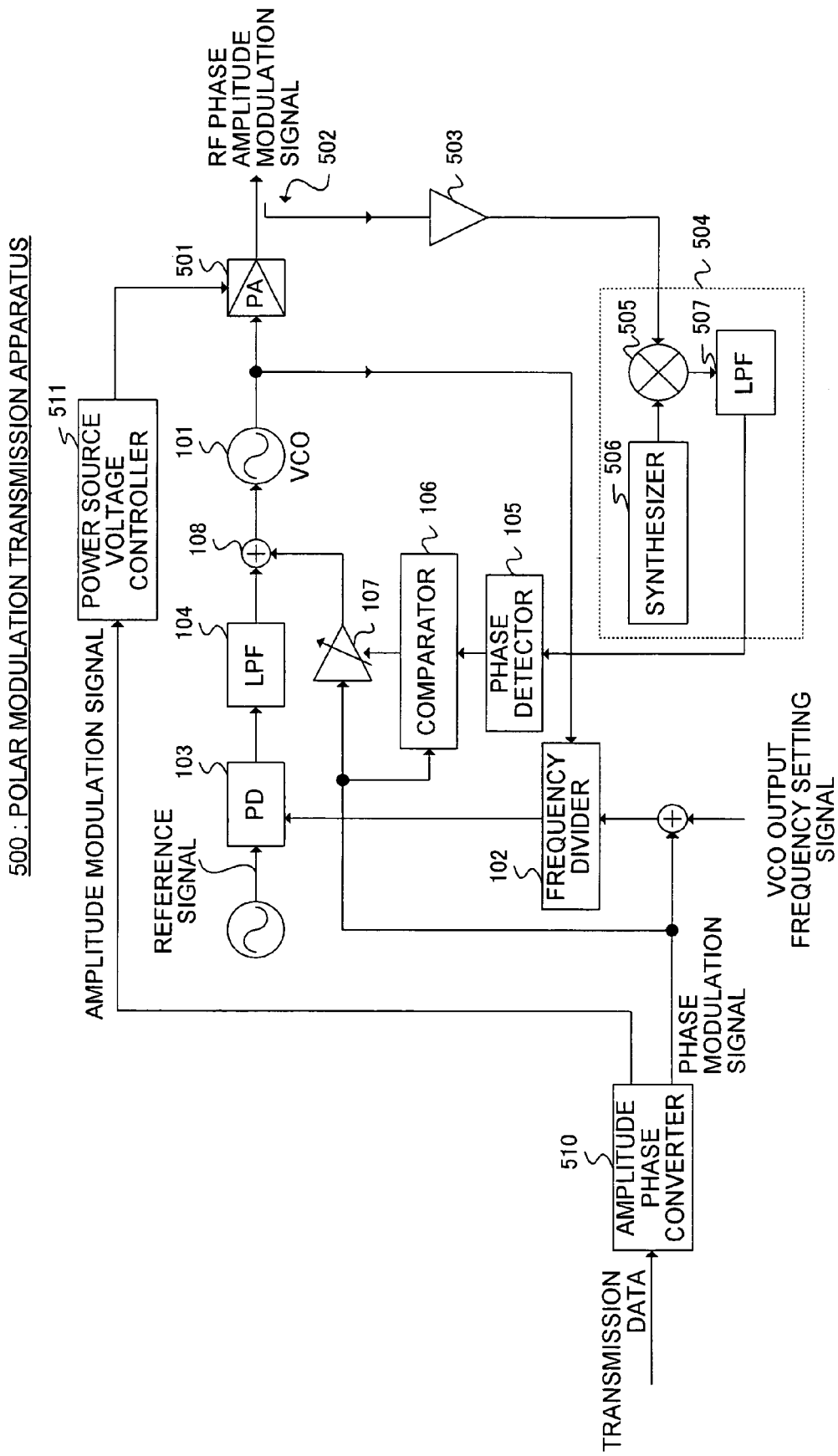
FIG. 12 is a block diagram showing a configuration of a polar modulation transmission apparatus according to Embodiment 5.

FIG. 12 illustrates the configuration of polar modulation transmission apparatus 500 of the present embodiment. Parts in FIG. 12 that are identical to ones in FIG. 6 will be assigned the same reference numerals as in FIG. 6.

Polar modulation transmission apparatus 500 has: amplitude phase converter 510; and high frequency power amplifier 501 (hereinafter "power amplifier" or "PA"); and power source voltage controller 511 that amplifies an amplitude modulation signal and forms the power source voltage to supply to power amplifier 501.

Polar modulation transmission apparatus 500 inputs baseband transmission data in amplitude phase converter 510. Amplitude phase converter 510 forms a base amplitude modulation signal and baseband phase modulation signal from the transmission data, and sends the amplitude modulation signal to power source voltage controller 511 and the phase modulation signal to the PLL circuit. Amplitude phase converter 510, power source voltage controller 511 and power amplifier 501 need only to employ configurations used in conventional polar modulation transmission apparatus, and these will not be described in detail here.

An RF phase modulation signal outputted from VCO 101 is sent to power amplifier (PA) 501. Power amplifier 501 changes the amplitude of the RF phase modulation signal having constant envelope in accordance with the amplitude modulation signal, and thereby obtains an RF phase amplitude modulation signal (transmission signal).

Phase modulation apparatus 500 has coupler 502 that detects the output signal of power amplifier 501 and limiter amplifier 503 that sets limits to the amplitude of the signal detected by coupler 502. By this means, the amplitude modulation component of the transmission signal (RF phase amplitude modulation signal) outputted from power amplifier 501 is removed by limiter amplifier 503.

The signal having the amplitude modulation component removed is sent to down converter 504 comprised of mixer 505, synthesizer 506 and low pass filter (LPF) 507, where the frequency of the signal is lowered, and the signal is sent to phase detector 105. The configuration and operations thereafter are the same as in Embodiment 1.

Thus, the present embodiment is configured to have: coupler 502 that detects a phase amplitude modulation signal outputted from power amplifier 501; limiter amplifier 503 that sets limits to the amplitude of the signal detected by coupler 502; phase detector 105 that performs phase detection with respect to the signal outputted from limiter amplifier 503; comparator 106 that compares the detected signal with a baseband phase modulation signal and outputs the difference between the two signals; and variable gain amplifier 107 that controls the gain of the phase modulation signal in accordance with the output of comparator 106 and supplies the gain-controlled baseband phase modulation signal to VCO 101, thus implementing phase modulation apparatus 500 that can improve the deterioration in modulation accuracy due to variation in the modulation sensitivity in VCO 101 and that can also compensate the AM-PM distortion that is produced in power amplifier 501.

Although a case has been described above with this embodiment where limiter amplifier 503 is used as an amplitude limiter, the amplitude limiter is by no means limited to this, and any circuits can be used as long as they are capable of making the amplitude of a signal a constant envelope. Down converter 504 may be omitted as well. In addition, circuits utilizing a linear mixer and gain control amplifier can be used instead of power amplifier 501. The point is to provide a coupler for signal detection after the amplitude modulator that changes the amplitude of an RF phase modulation signal in accordance with an amplitude modulation signal.

Embodiment 6

Figure 13:
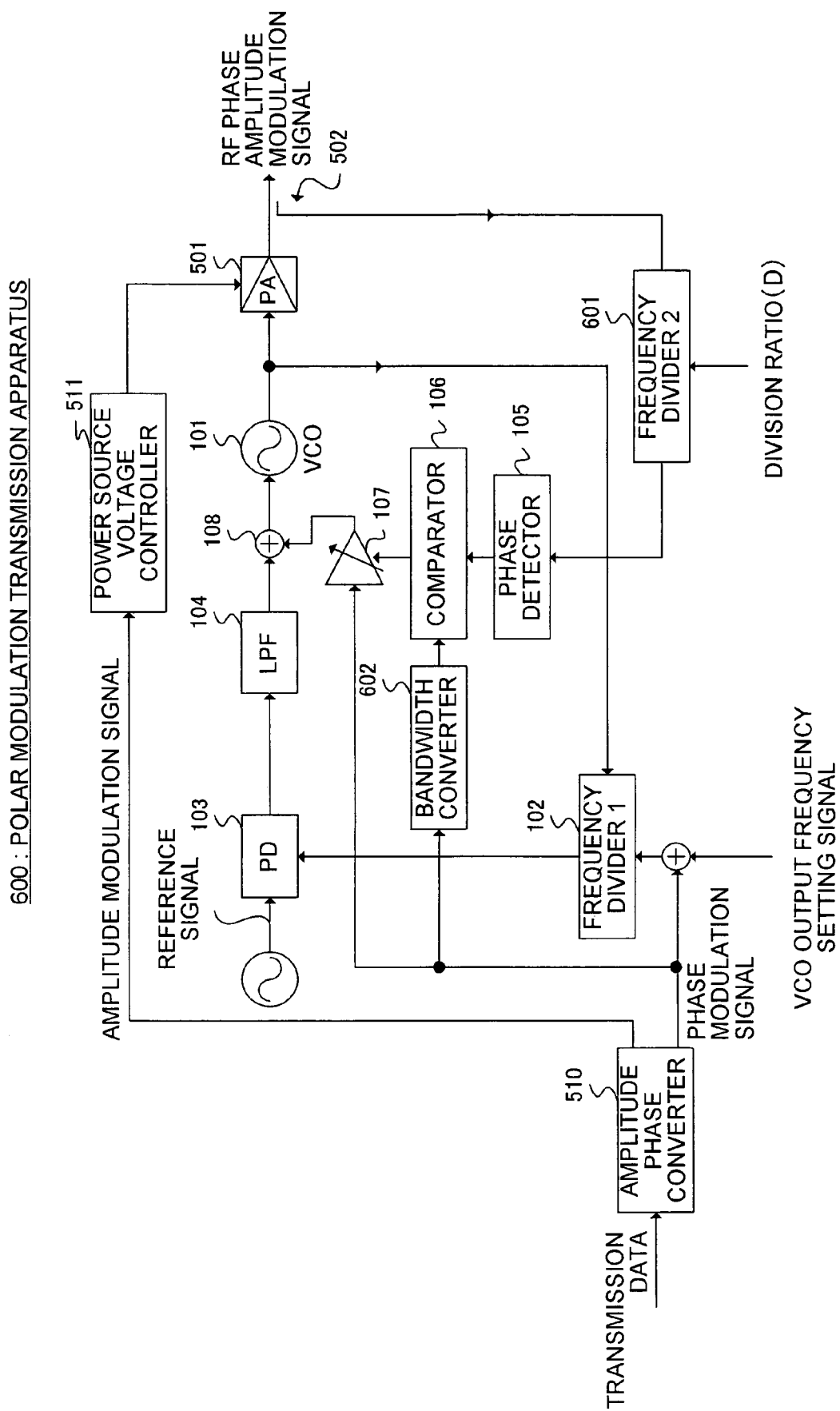
FIG. 13 is a block diagram showing a configuration of a polar modulation transmission apparatus according to Embodiment 6.

FIG. 13 illustrates the phase modulation apparatus of the present embodiment. Parts in FIG. 13 that are identical to ones in FIG. 12 will be assigned the same reference numerals as in FIG. 12. In comparison to polar modulation transmission apparatus 500 of Embodiment 5, polar modulation transmission apparatus 600 is configured virtually the same as polar modulation apparatus 500 of Embodiment 5, except that phase modulation apparatus 600 has frequency divider 601 instead of limiter amplifier 503 and down converter 504, and bandwidth conversion circuit 602 that converts the bandwidth of a baseband phase modulation signal to 1/D in accordance with the frequency division ratio D in frequency divider 601 and supplies to result to comparator 106.

This frequency divider 601 has amplitude limiting function in addition to frequency dividing function, so that the amplitude limiter such as limiter amplifier 503 can be omitted. By this means, phase modulation transmission apparatus 600 achieves the same advantage as Embodiment 5 by a simpler configuration.

Other Embodiments

Figure 14:
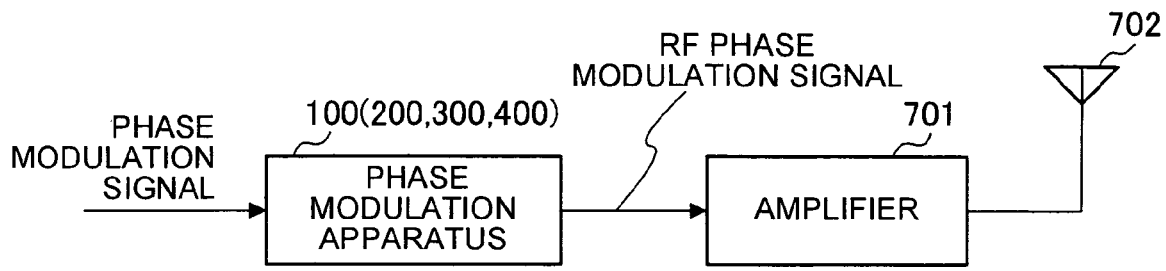
FIG. 14 is a block diagram showing a configuration of a wireless transmission apparatus according to another embodiment.

FIG. 14 illustrates a configuration of a wireless transmission apparatus equipped with the phase modulation apparatus according to one of Embodiments 1 to 4. Wireless transmission apparatus 700 has: frequency modulation apparatus 100 (200, 300, 400) according one of Embodiments 1 to 4; amplifier 701 that amplifies an RF modulation signal obtained by frequency modulation apparatus 100 (200, 300, 400); and antenna 702 that transmits the amplified signal. By this means, wireless transmission apparatus 700 makes it possible to achieve excellent RF phase modulation signals even when the modulation sensitivity of VCO 101 in phase modulation apparatus 100 (200, 300, 400) varies, and therefore makes it possible to transmit high quality signals. For example, the heat produced in amplifier 701 and external temperature place phase modulation apparatus 100 (200, 300, 400) in an environment that is diverse in terms of temperature, and thereby even when changes in temperature make the modulation sensitivity vary in VCO 101, the present embodiment still achieves high quality signals.

Figure 15:
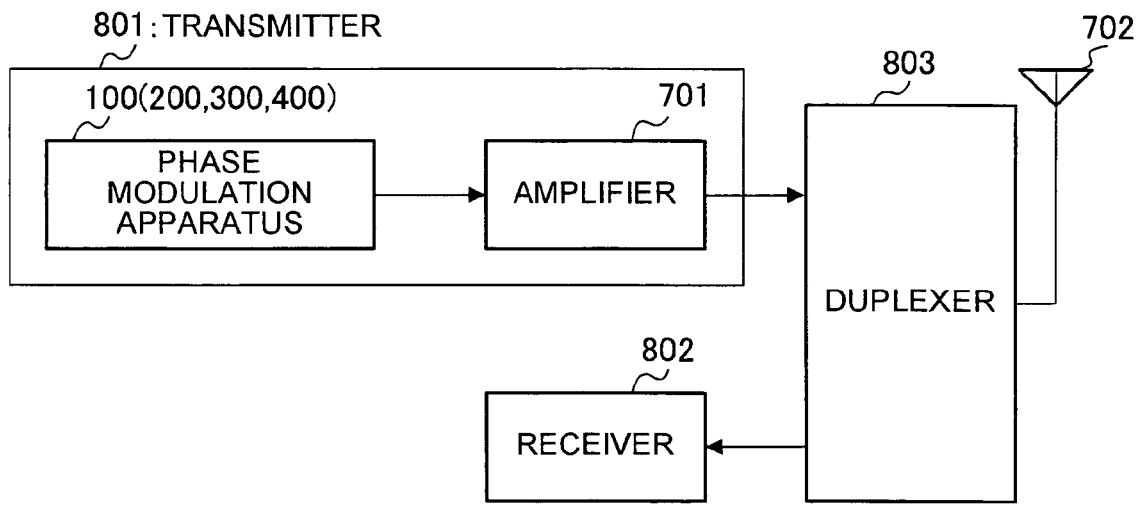
FIG. 15 is a block diagram showing a configuration of a wireless communication apparatus according to another embodiment.

FIG. 15 illustrates a configuration of a wireless communication apparatus comprising the phase modulation apparatus according to one of embodiments 1–4. Wireless transmission apparatus 800 has: transmitter 801 including phase modulation apparatus 100 (200, 300, 400) according to one of Embodiments 1–4 and amplifier 701; receiver 802 that performs predetermined receiving processing of a received signal including demodulation processing; duplexer 803 that switches between transmission signals and reception signals; and antenna 702. By this means, wireless communication apparatus 800 is able to transmit high quality signals even when the modulation sensitivity of voltage controlled oscillator 101 in phase modulation apparatus 100 (200, 300, 400) varies. In particular, in mobile terminals such as mobile telephone devices, the temperature of the voltage controlled oscillator changes in a wide range with transmission power control and external temperature changes, and so the present invention would be suitable for use in mobile terminals such as mobile telephone devices.

As described above, in accordance with one aspect of the present invention, the two-point phase modulation apparatus of the present invention employs a configuration having: a PLL circuit; a frequency divider that is provided in the PLL circuit and sets a frequency division ratio of the PLL circuit based on a baseband modulation signal and a carrier frequency signal; an adder that is provided between a low pass filter and a voltage controlled oscillator in the PLL circuit and adds voltage in accordance with the baseband modulation signal to output voltage of the low pass filter and supplies a resulting voltage to a control voltage terminal of the voltage controlled oscillator; a phase detector that performs phase detection with respect to an RF phase modulation signal outputted from the voltage controlled oscillator; a comparator that compares a phase of the RF phase modulation signal after the phase detection with a phase of the baseband modulation signal and outputs a difference between the signals; and a gain controller that controls a gain of the baseband modulation signal based on an output of the comparator and outputs the gain-controlled baseband modulation signal to the adder.

According to this configuration, the gain of the baseband modulation signal is controlled in accordance with the actual modulation sensitivity of the voltage controlled oscillator, thereby allowing the voltage controlled oscillator to output excellent RF modulation signals.

In accordance with another aspect of the present invention, the phase modulation apparatus of the present invention employs a configuration further having a down converter that down converts the RF modulation signal outputted from the voltage controlled oscillator and supplies a result to the phase detector.

According to this configuration, the phase detector detects the phase of a modulation signal that is down converted to a lower frequency, so that it is possible to simplify the configuration of the phase detector and improve the accuracy of detection.

In accordance with another aspect of the present invention, the phase modulation apparatus of the present invention employs a configuration further having: a second frequency divider that divides a frequency of the RF phase modulation signal outputted from the voltage controlled oscillator and supplies a result to the phase detector; and a bandwidth converter that converts a bandwidth of the baseband modulation signal in accordance with the frequency division ratio of the second frequency divider and supplies a result to the comparator.

According to this configuration, the phase detector detects the phase of the modulation signal that is frequency divided to a lower frequency, so that it is possible to simplify the configuration of the phase detector and improve the accuracy of detection. In addition, the baseband modulation signal is converted to a bandwidth in accordance with the frequency division ratio of the bandwidth conversion circuit and then inputted in the comparator, so that the comparator is able to compare signals of the same bandwidth.

In accordance with yet another aspect of the present invention, the phase modulation apparatus of the present invention employs a configuration in which the phase detector performs phase detection with respect to a signal outputted from the frequency divider instead of the RF phase modulation signal and said phase modulation apparatus further has a bandwidth converter that converts a bandwidth of the baseband modulation signal in accordance with the frequency division ratio of the frequency divider and supplies a result to the comparator.

According to this configuration, the low frequency signal after the frequency division enables phase detection, without down converting the RF modulation signal, so that a down converter is not necessary that is comprised of a mixer and a synthesizer and consequently it is possible to simplify the configuration, minimize power consumption, and improve the accuracy of detection. In addition, the baseband modulation signal is converted to a bandwidth in accordance with the frequency division ratio of the bandwidth conversion circuit and then inputted in the comparator, so that the comparator is able to compare signals of the same bandwidth.

In accordance with another aspect of the present invention, the polar modulation transmission apparatus of the present invention employs a configuration having: an amplitude phase converter that forms a phase modulation signal and an amplitude modulation signal based on transmission data; a PLL circuit that receives as input the phase modulation signal and outputs an RF phase modulation signal; a frequency divider that is provided in the PLL circuit and sets a frequency division ratio of the PLL circuit based on the phase modulation signal and a carrier frequency signal; an adder that is provided between a low pass filter and a voltage controlled oscillator in the PLL circuit and adds voltage in accordance with the phase modulation signal to output voltage of the loop filter and supplies a resulting voltage to a control voltage terminal of the voltage controlled oscillator; and a high frequency power amplifier that changes an amplitude of the RF phase modulation signal outputted from the voltage controlled oscillator in accordance with the amplitude modulation signal; a coupler that detects an output signal of the high frequency power amplifier; an amplitude limiter that sets a limit to the amplitude of the signal detected by the coupler; a phase detector that performs phase detection with respect to the signal outputted from the amplitude limiter; a comparator that compares the signal after the phase detection with the phase modulation signal and outputs a difference between the signals; and a gain controller that controls a gain of the phase modulation signal based on an output of the comparator and outputs the gain-controlled phase modulation signal to the adder.

According to this configuration, the amplitude limiter removes the amplitude modulation component from the transmission signal outputted from the high frequency power amplifier. The signal is then subjected to phase detection and then compared with the baseband phase modulation signal. In accordance with this result, the signal level of the baseband phase modulation signal to be supplied is controlled just before the voltage controlled oscillator, thus implementing a polar modulation transmission apparatus that can improve the deterioration in modulation accuracy due to variation in the modulation sensitivity in the voltage controlled oscillator and that can also compensate the AM-PM distortion that is produced in the amplitude modulator.

In accordance with another aspect of the present invention, the polar modulation transmission apparatus of the present invention employs a configuration further having a down converter that down converts a signal to be inputted in the phase detector.

According to this configuration, the signal down converted in the phase detector is subjected to phase detection, so that it is possible to simplify the configuration of the phase detector and improve then accuracy of detection.

In accordance with another aspect of the present invention, the polar modulation transmission apparatus of the present invention employs a configuration having: an amplitude phase converter that forms a phase modulation signal and an amplitude modulation signal based on transmission data; a PLL circuit that receives as input the phase modulation signal and outputs an RF phase modulation signal; a frequency divider that is provided in the PLL circuit and sets a frequency division ratio of the PLL circuit based on the phase modulation signal and a carrier frequency signal; an adder that is provided between a low pass filter and a voltage controlled oscillator in the PLL circuit and adds voltage in accordance with the phase modulation signal to output voltage of the loop filter and supplies a resulting voltage to a control voltage terminal of the voltage controlled oscillator; a high frequency power amplifier that changes an amplitude of the RF phase modulation signal outputted from the voltage controlled oscillator in accordance with the amplitude modulation signal; a coupler that detects an output signal of the high frequency power amplifier; a second frequency divider that divides a frequency of the signal detected by the coupler and supplies a result to the phase detector; a phase detector that performs phase detection with respect to a signal outputted from the second frequency divider; a bandwidth converter that converts a bandwidth of the phase modulation signal in accordance with the frequency division ratio of the second frequency divider; a comparator that compares the signal after the phase detection by the phase detector with the phase modulation signal after the bandwidth conversion by the bandwidth converter and outputs a difference between the signals; and a gain controller that controls a gain of the phase modulation signal based on an output of the comparator and outputs the gain-controlled phase modulation signal to the adder.

According to this configuration, the frequency divider has amplitude limiting function in addition to frequency dividing function, so that the frequency divider is able to output a transmission signal having its frequency lowered and its amplitude modulation component removed. The signal is then subjected to phase detection and then compared to the baseband phase modulation signal. In accordance with this result, the signal level of the baseband phase modulation signal to be supplied is controlled just before the voltage controlled oscillator, thus implementing a polar modulation transmission apparatus that can improve the deterioration in modulation accuracy due to variation in the modulation sensitivity in the voltage controlled oscillator and that can also compensate the AM-PM distortion that is produced in the amplitude modulator.

In accordance with another aspect of the present invention, the wireless transmission apparatus of the present invention employs a configuration having: one of the above-described phase modulation apparatuses; and an amplifier that amplifies the RF phase modulation signal outputted from the phase modulation apparatus.

In accordance with another aspect of the present invention, the wireless communication apparatus of the present invention employs a configuration having: a transmitter having one of the above-described phase modulation apparatuses; a receiver that demodulates a received signal; an antenna; and a duplexer that switches between supplying a transmission signal from the transmitter to the antenna and supplying the received signal from the antenna to the receiver.

According to these configurations, it is possible to achieve excellent RF phase modulation signals even when the modulation sensitivity of the voltage controlled oscillator in the phase modulation apparatus varies and transmit high quality signals. For example, the heat produced in the amplifier and external temperature place the phase modulation apparatus in an environment that is diverse in terms of temperature, and thereby even when changes in temperature make the modulation sensitivity vary in the voltage controlled oscillator, it is still possible to transmit high quality signals.

The present invention is not limited to the above described embodiments, and various variations and modifications may be possible without departing from the scope of the present invention.

This application is based on Japanese Patent Application No. 2004-73172 filed on Mar. 15, 2004, the entire content of which is expressly incorporated by reference herein.

What is claimed is:

1. A two point phase modulation apparatus comprising:
   a PLL circuit;
   a first adder that adds a baseband modulation signal and a carrier frequency signal;
   a frequency divider that is provided in the PLL circuit and sets a frequency division ratio of the PLL circuit based on an output of the first adder
   a second adder that is provided between a low pass filter and a voltage controlled oscillator in the PLL circuit and adds a voltage in accordance with the baseband modulation signal to an output voltage of the low pass filter and supplies a resulting voltage to a control voltage terminal of the voltage controlled oscillator;
   a phase detector that performs phase detection with respect to an RF phase modulation signal outputted from the voltage controlled oscillator;
   a comparator that compares a phase of the RF phase modulation signal after the phase detection with a phase of the baseband modulation signal and outputs a difference between the signals; and
   a gain controller that controls a gain of the baseband modulation signal based on an output of the comparator and outputs the gain-controlled baseband modulation signal to the second adder.

2. The phase modulation apparatus of claim 1, further comprising a down converter that down-converts the RF modulation signal outputted from the voltage controlled oscillator and supplies a result to the phase detector.

3. The phase modulation apparatus of claim 1, further comprising a second frequency divider that divides a frequency of the RF phase modulation signal outputted from the voltage controlled oscillator and supplies a result to the phase detector; and
   a bandwidth converter that converts a bandwidth of the baseband modulation signal in accordance with the frequency division ratio of the second frequency divider and supplies a result to the comparator.

4. The phase modulation apparatus of claim 1, wherein:
   said phase detector performs phase detection with respect to a signal outputted from the frequency divider instead of the RF phase modulation signal; and
   said phase modulation apparatus further comprising a bandwidth converter that converts a bandwidth of the baseband modulation signal in accordance with the frequency division ratio of the frequency divider and supplies a result to the comparator.

5. A polar modulation transmission apparatus comprising:
an amplitude phase converter that forms a phase modulation signal and an amplitude modulation signal based on transmission data;
a PLL circuit that receives as input the phase modulation signal and outputs an RF phase modulation signal;
a frequency divider that is provided in the PLL circuit and sets a frequency division ratio of the PLL circuit based on the phase modulation signal and a carrier frequency signal;
an adder that is provided between a low pass filter and a voltage controlled oscillator in the PLL circuit and adds voltage in accordance with the phase modulation signal to output voltage of the loop filter and supplies a resulting voltage to a control voltage terminal of the voltage controlled oscillator; and
a high frequency power amplifier that changes an amplitude of the RF phase modulation signal outputted from the voltage controlled oscillator in accordance with the amplitude modulation signal;
a coupler that detects an output signal of the high frequency power amplifier;
an amplitude limiter that sets a limit to the amplitude of the signal detected by the coupler;
a phase detector that performs phase detection with respect to the signal outputted from the amplitude limiter;
a comparator that compares the signal after the phase detection with the phase modulation signal and outputs a difference between the signals; and
a gain controller that controls a gain of the phase modulation signal based on an output of the comparator and outputs the gain-controlled phase modulation signal to the adder.

6. The polar modulation transmission apparatus of claim 5, further comprising a down converter that down-converts a signal inputted in the phase detector.

7. A polar modulation transmission apparatus comprising:
an amplitude phase converter that forms a phase modulation signal and an amplitude modulation signal based on transmission data;
a PLL circuit that receives as input the phase modulation signal and outputs an RF phase modulation signal;
a frequency divider that is provided in the PLL circuit and sets a frequency division ratio of the PLL circuit based on the phase modulation signal and a carrier frequency signal;
an adder that is provided between a low pass filter and a voltage controlled oscillator in the PLL circuit and adds voltage in accordance with the phase modulation signal to output voltage of the loop filter and supplies a resulting voltage to a control voltage terminal of the voltage controlled oscillator;
a high frequency power amplifier that changes an amplitude of the RF phase modulation signal outputted from the voltage controlled oscillator in accordance with the amplitude modulation signal;
a coupler that detects an output signal of the high frequency power amplifier;
a second frequency divider that divides a frequency of the signal detected by the coupler and supplies a result to the phase detector;
a phase detector that performs phase detection with respect to a signal outputted from the second frequency divider;
a bandwidth converter that converts a bandwidth of the phase modulation signal in accordance with the frequency division ratio of the second frequency divider;
a comparator that compares the signal after the phase detection by said phase detector with the phase modulation signal after the bandwidth conversion by said bandwidth converter and outputs a difference between the signals; and
a gain controller that controls a gain of the phase modulation signal based on an output of the comparator and outputs the gain-controlled phase modulation signal to the adder.

8. A wireless transmission apparatus comprising:
the phase modulation apparatus of claim 1; and
an amplifier that amplifies an RF phase modulation signal outputted from said phase modulation apparatus.

9. A wireless communication apparatus comprising:
a transmitter having the phase modulation apparatus of claim 1;
a receiver that demodulates a received signal;
an antenna; and
a duplexer that switches between supplying a transmission signal from the transmitter to the antenna and supplying the received signal from the antenna to the receiver.

* * * * *